United States Patent
Gao et al.

(10) Patent No.: US 7,129,552 B2
(45) Date of Patent: Oct. 31, 2006

(54) MOSFET STRUCTURES WITH CONDUCTIVE NIOBIUM OXIDE GATES

(75) Inventors: Wei Gao, Vancouver, WA (US); Yoshi Ono, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 130 days.

(21) Appl. No.: 10/677,006

(22) Filed: Sep. 30, 2003

(65) Prior Publication Data

US 2005/0067664 A1    Mar. 31, 2005

(51) Int. Cl.
H01L 29/76 (2006.01)
H01L 29/94 (2006.01)

(52) U.S. Cl. .................................... 257/411; 257/412
(58) Field of Classification Search ............... 257/295, 257/296, 751, 640, 635, 411, 412, 649
See application file for complete search history.

(56) References Cited

U.S. PATENT DOCUMENTS 4,238,758 A * 12/1980 Suzuki ................. 257/253
6,468,852 B1 * 10/2002 Gonzalez et al. .......... 438/217
6,489,645 B1 * 12/2002 Uchiyama .................. 257/295

FOREIGN PATENT DOCUMENTS

JP    5-29024    *  2/1993
JP    9-218172   *  8/1997

OTHER PUBLICATIONS

T. P. Ma, "High-k Gate Dielectrics for Scaled CMOS Technology," Proc. 6th Int'l Conf. on Solid State and IC Tech., Oct. 22-25, 2001, pp. 297-302.*
Syd R. Wilson, Clarence J. Tracy and John L. Freeman, Jr., "Handbook of Multilevel Metallization for Integrated Circuits," Noyes Publ., Westwood, N.J. (1993) p. 42.*
"Work Function Determination of Zinc Oxide Films" by Sundaram et al., pp. 674-676, 1996 IEEE.*
Article entitled: Nb Oxide Thin Film Resistors; by Wilson et al., published in IEEE Transactions on Applied Superconductivity, vol. 9, No. 2, Jun. 1999.
Article entitled: Properties of Ru—Ta Alloys as Gate Electrodes For NMOS and PMOS Silicon Devices, by Zhong et al., IEEE, 2001.
Article entitled: Tunable Work Function Molybdenum Gate Technology for FDSOI-CMOS, by Ranade et al., IEEE 2002.
Article entitled: A Phase Map for Sputter Deposited Niobium Oxides, by Lee and Aita, pub in the Journal of Applied Physics, vol. 70, No. 4, Aug. 15, 1991.

* cited by examiner

Primary Examiner—Steven Loke
(74) Attorney, Agent, or Firm—Law Office of Gerald Maliszewski; Gerald Maliszewski

(57) ABSTRACT

MOSFET gate structures are provided comprising a niobium monoxide gate, overlying a gate dielectric. The niobium monoxide gate may have a low work function suitable for use as an NMOS gate.

1 Claim, 4 Drawing Sheets

MOSFET STRUCTURES WITH CONDUCTIVE NIOBIUM OXIDE GATES

BACKGROUND OF THE INVENTION

The present invention relates generally to methods of forming niobium monoxide and, more particularly, to methods of depositing niobium monoxide suitable for use as MOSFET gates.

As the gate length of silicon CMOS devices are scaled below 100 nm, new high-k materials are expected to replace silicon dioxide as the gate insulating material, and new gate materials, including metal gates, are expected to replace polycrystalline silicon. These new gate materials are expected to solve the polysilicon gate depletion problem. The new gate materials may also enable threshold voltage adjustment without the need to alter the channel doping.

The new gate materials should have an appropriate work function. For CMOS devices, the gate materials should have a work function of approximately 4.2 eV for NMOS gates. The gate materials should have a work function of approximately 5.0 eV for the PMOS gates. It is possible to use different gate materials for the two different kinds of gates, NMOS and PMOS, in the CMOS process.

The new gate materials should be stable. NMOS metals are often highly reactive and normally unstable in contact with the gate dielectric. PMOS metals are more stable but more difficult to process. Even if chemically stable materials are identified, they should also be mechanically stable as well. The new gate materials should not exhibit poor adhesion. The new gate materials should not diffuse into the channel.

It would be desirable to have new gate materials that could be integrated into existing IC processes, such as having deposition and etching process that can be incorporated into existing processes.

The available choices for new gate materials include elemental metals, binary alloys, ternary alloys or even more complex materials. There are many materials that may qualify as PMOS gate candidates. However, qualified NMOS gate candidates, having a low work function, are very limited. One of the challenges for NMOS gate candidates is having a low enough work function, for example around 4.2 eV along with good stability in contact with the gate dielectric.

Binary alloys of RuTa or MoN have been explored. By altering the composition of these binary metal alloys it is possible to control the work function of the resulting material. However, when the work function of these alloys is targeted to values suitable for NMOS gates, work function below 4.3 eV, the thermal stability tends to deteriorate.

SUMMARY OF THE INVENTION

Accordingly, MOSFET gate structures are provided comprising conductive niobium monoxide gates. The gate structures may be formed as standard CMOS gates or as replacement gate structures. A gate dielectric, for example silicon dioxide or a high-k gate material, is interposed between the niobium monoxide gates and the substrate.

DETAILED DESCRIPTION OF THE INVENTION

Niobium monoxide (NbO) is a metal-monoxide characterized by a high conductivity, which is a property usually associated with metals. NbO gates have a work function between approximately 4.1 eV and 4.4 eV following annealing processes, which makes them suitable for NMOS gates. The reaction between Nb and O is exothermic, which makes it difficult to control the reaction and prevent $Nb_2O_5$ from being formed. $Nb_2O_5$ is an insulator, which would not be suitable for use as a gate material. Nb and O may also combine to from $NbO_2$, which is also not suitable for use as a gate material. For our purposes we will use $NbO_x$ to refer generally to niobium oxides without regard to a specific phase. NbO will refer specifically to materials comprising niobium monoxide. The present method provides a means of depositing a predominantly NbO film, which means a NbO film that may contain some other phases of niobium oxide, or elemental niobium. The term NbO gate, NbO film, and NbO material refer herein to materials comprised of predominantly NbO with levels of impurities including $NbO_2$, or elemental niobium, which are at levels that will not prevent the NbO from acting as an NMOS gate.

Figure 1:
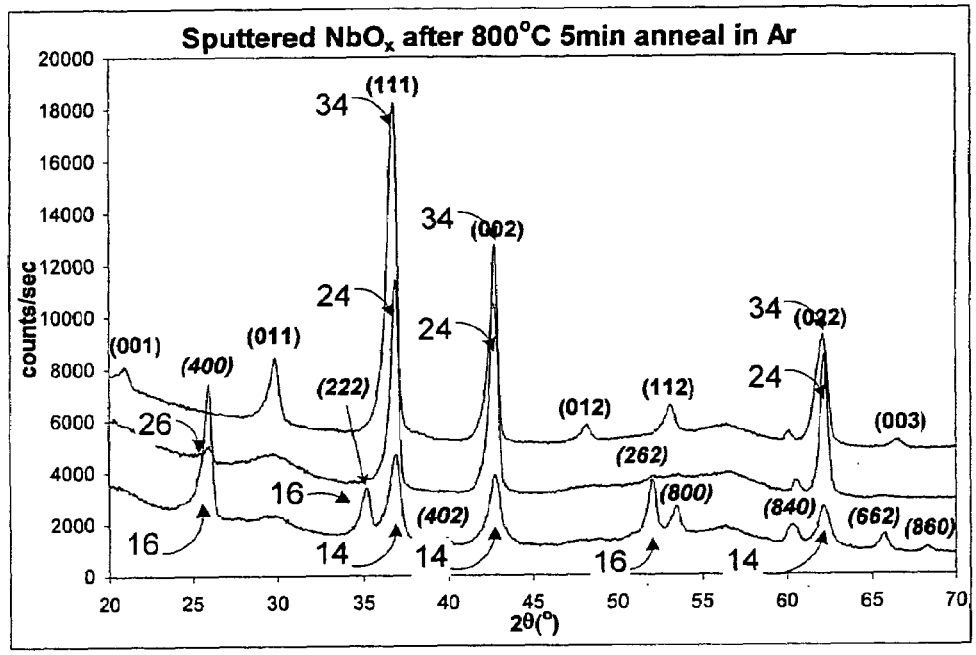
FIG. 1 shows XRD plots.

For the following examples, an Edwards Auto 306 DC magnetron sputtering system was used with a 99.95% pure Nb target. Argon and oxygen gases were introduced. A total pressure of 6 mtorr was maintained during film deposition. The oxygen content of the NbOx film is controlled by adjusting the partial pressures of oxygen $[P_{O2}/(P_{O2}+P_{Ar})]$. The relative oxygen content of the deposited NbOx film is also changed by varying the sputtering power. By adjusting these parameters it is possible to produce a predominantly NbO film. After sputtering the as deposited films were annealed at approximately 800 degrees Celsius for approximately 5 minutes in argon. FIG. 1 shows the x-ray diffraction (XRD) measurements associated with the following three examples.

EXAMPLE 1

A 300 W sputtering power was used with an $O_2$ partial pressure of approximately 30%. The $O_2$ partial pressure was established using mass flow controllers to control the amount of both $O_2$ and argon entering the sputtering chamber. The resulting film is a mix of NbO and $NbO_2$, which corresponds to XRD plot 12 in FIG. 1. The NbO peaks 14 indicate the presence of NbO, while the $NbO_2$ peaks 16 indicate the presence of $NbO_2$. The results of this example may not contain a sufficient amount of NbO to act as a suitable gate material, but the example is presented to illustrate the effect of changing oxygen partial pressure.

EXAMPLE 2

A 300 W sputtering power was used with an $O_2$ partial pressure of approximately 25%. The $O_2$ partial pressure was established using mass flow controllers to control the amount both $O_2$ and argon entering the sputtering chamber. The resulting film, which corresponds to XRD plot 22, is predominantly NbO, with detectable levels of $NbO_2$. An $NbO_2$ peak 26 is still discernable, but the NbO peaks 24 are even more apparent than in Example 1. Although, some $NbO_2$ is present this predominantly NbO film is suitable for use as an NbO gate.

EXAMPLE 3

The sputtering power was increased to 350 W while the $O_2$ partial pressure was maintained at approximately 25%. The $O_2$ partial pressure was established using mass flow controllers to control the amount both $O_2$ and argon entering the sputtering chamber. The resulting film, which corresponds to XRD plot 32, is predominantly NbO, without any discernable $NbO_2$ peaks. The NbO peaks 34 are even more apparent than in Example 2.

Among the three examples just provided, Example 3 provides a NbO film with the least amount of discernable $NbO_2$. Example 2 may still be suitable for use as an NbO gate, provided the increased resistivity caused by the $NbO_2$ does not significantly degrade the overall performance as an NMOS gate.

Figure 2:
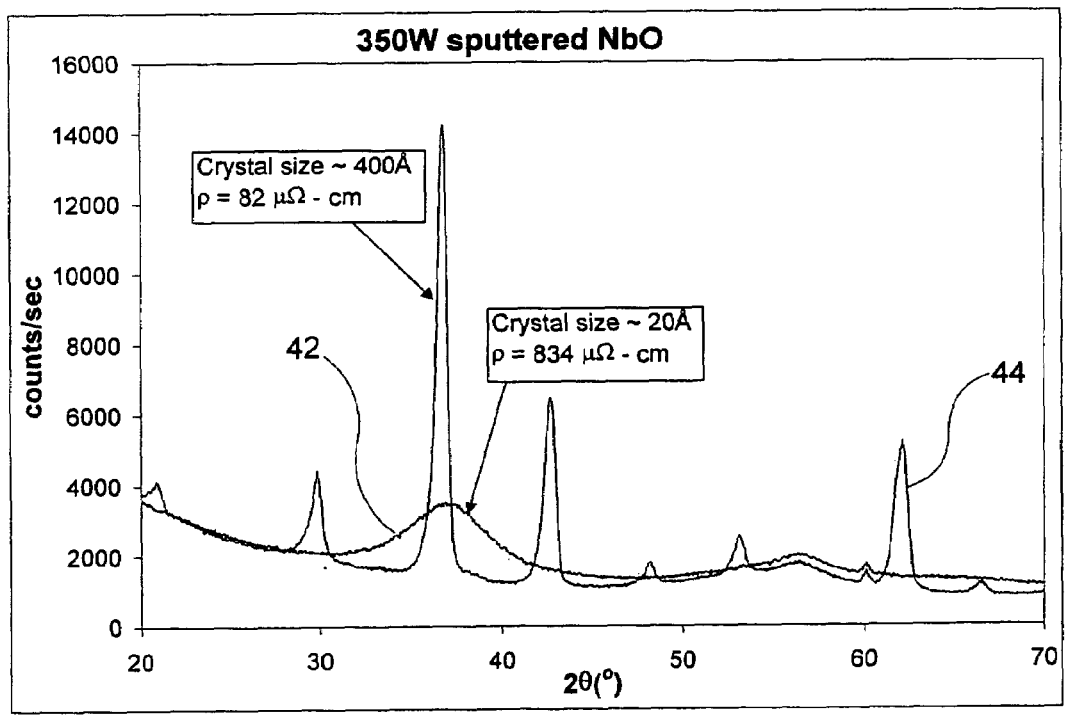
FIG. 2 shows XRD plots.

FIG. 2 shows XRD measurements for the material produced by Example 3, before and after anneal at approximately 800 degrees Celsius for approximately 5 minutes in argon. FIG. 2 shows that the as-deposited NbO film, which corresponds to XRD plot 42, has a broad peak around NbO (111). XRD plot 44 corresponds to the NbO film after anneal and shows additional peaks indicative of single phase NbO. The anneal increased crystal size from 2 nm before anneal to 40 nm after anneal. The anneal also reduced the resistivity of approximately 830 µΩ-cm before anneal to approximately 82 µΩ-cm.

The density of the NbO film produced using the process of Example 3 was determined to be approximately 7.55 g/cm$^3$, which compares favorably with the published density for bulk NbO of 7.265 g/cm$^3$.

EXAMPLE 4

Figure 3:
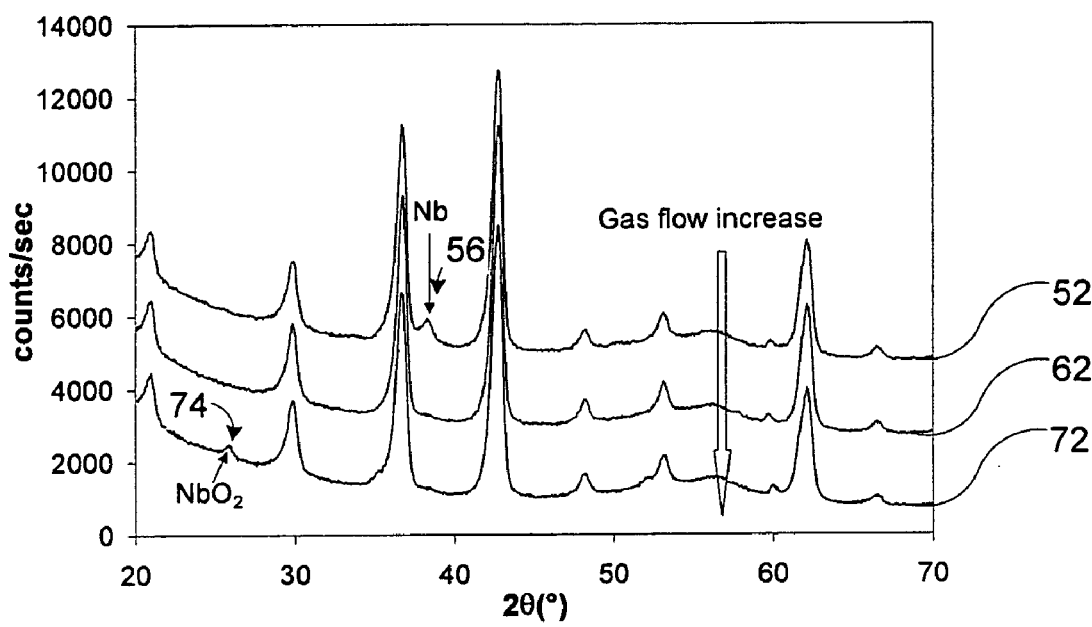
FIG. 3 shows XRD plots.

Another method of sputtering $NbO_x$ also uses the Edwards Auto 306 DC magnetron sputtering system with a 99.95% pure Nb target. The sputtering power of 300 W was selected. In this example, instead of introducing separate sources of argon and oxygen a 15% $O_2$/Ar gas is used. Using a combined gas makes the process less subject to the uncertainty of the mass flow controllers. To adjust the $O_2$ partial pressure the 15% $O_2$/Ar flow rate was increased. Adjusting the flow rate changed the partial pressure because the Edwards system used has a constant pump rate. When the flow rate is increased the $NbO_x$ film becomes oxygen rich. Decreasing the flow rate causes the $NbO_x$ film to become oxygen deficient. FIG. 3 shows the XRD results for three films produced at 15% $O_2$/Ar flow rates of between approximately 2.65 sccm and 2.85 sccm after annealing at approximately 800 degrees Celsius for approximately 5 minutes in argon. The XRD plot 52 shows the NbO peaks along with an Nb peak 56, which indicates the presence of elemental niobium. The XRD plot 62 shows the NbO peaks without any discernable peaks suggesting elemental niobium or $NbO_2$. The XRD plot 72 shows the NbO peaks along with a peak 74 indicating the presence of $NbO_2$.

Figure 4:
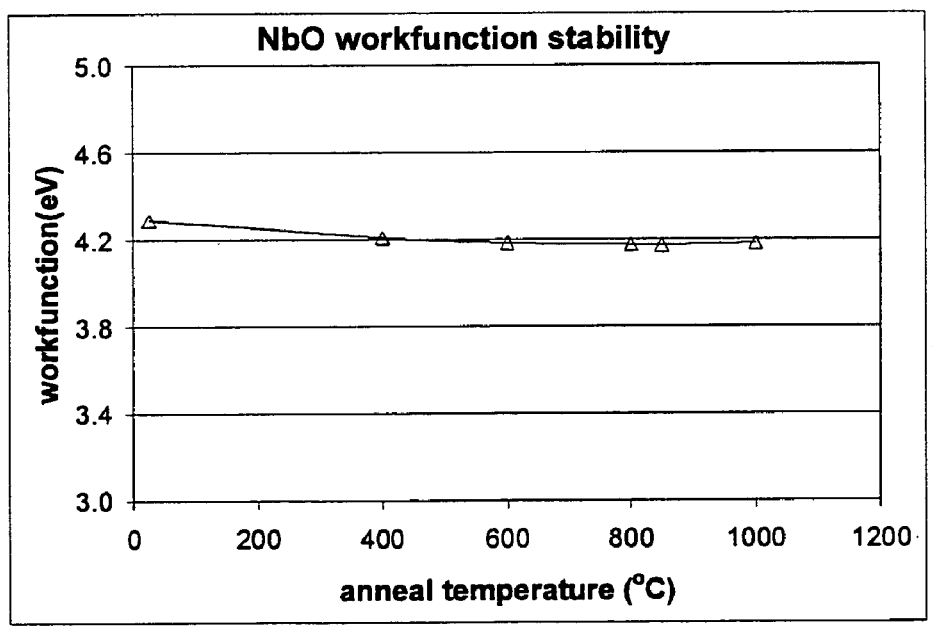
FIG. 4 shows a plot of work function versus anneal temperature.

FIG. 4 shows the work function of examples of NbO gates as a function of anneal temperature. This indicates that it is possible to achieve NbO gates with stable work functions approaching approximately 4.2 eV.

The NbO films produced according to the above method have a work function of approximately 4.2±0.1. The work function is stable, following an initial low temperature anneal at 400 degrees Celsius for 30 minutes in argon, up to subsequent anneal temperatures as high as 1000 degrees Celsius for 1 minute in argon. The NbO materials also demonstrated stability in contact with the gate dielectric, both silicon dioxide and high-k materials. For example, NbO films on ALD HfO2 were tested by annealing at temperatures up to 1000 degrees Celsius. Following an 800 degrees Celsius anneal the effective oxide thickness (EOT) changed from 33 angstroms to 30 angstroms, but this value was then stable after 1000 degrees Celsius anneal.

The sputtering examples provided above tend to be equipment dependent. Those of ordinary skill in the art will be able to produce NbO films, without undue experimentation based upon the above examples, using different equipment by adjusting the $O_2$ partial pressure and the sputtering power.

Although in the examples provided argon was combined with $O_2$ to control the partial pressure, other gases may be used including neon, helium, krypton, xenon or a combination.

Figure 5:
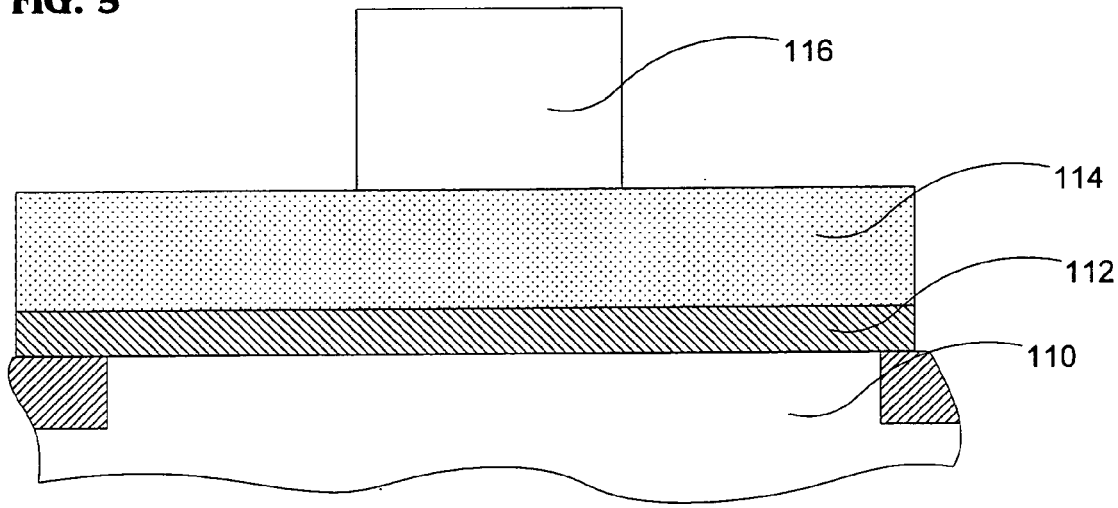
FIG. 5 shows a cross-sectional view of a gate structure during CMOS processing.

NbO can be deposited to form a MOSFET gate. In one embodiment, the MOSFET gate is fabricated using a standard CMOS flow. As shown in FIG. 5, a substrate 110 is provided. A gate dielectric material 112 is deposited overlying the substrate. The gate dielectric material is silicon dioxide, which may be deposited by thermal oxidation or plasma oxidation of a silicon substrate, or a high-k dielectric material, such as $HfO_2$, $ZrO_2$, $Ta_2O_5$, or $Al_2O_3$. A layer of niobium monoxide 114 is then deposited overlying the gate dielectric material. As described above, the layer of niobium monoxide can be deposited by sputtering, and adjusting the oxygen partial pressure, and the sputtering power to control the amount of oxygen incorporated into the film to produce a niobium monoxide film, without significant amounts of oxygen rich insulating phases of $NbO_x$ being incorporated into the film. The niobium monoxide 114 is then annealed as described above. A layer of photoresist 116 is then deposited and patterned.

Figure 6:
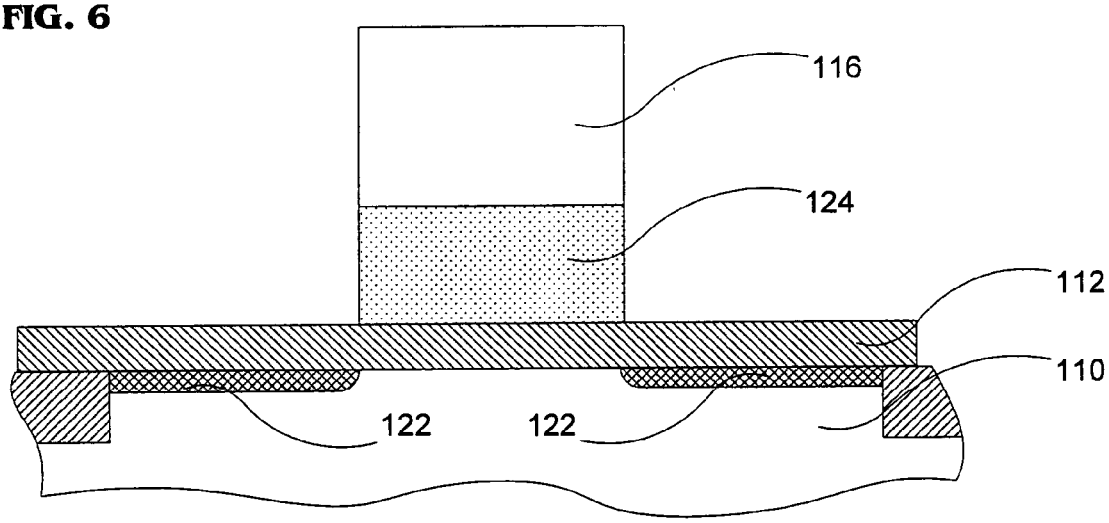
FIG. 6 shows a cross-sectional view of a gate structure during CMOS processing.

As shown in FIG. 6, source and drain regions 122 are implanted and activated. The activation anneal for the source and drain regions may serve to further anneal the niobium monoxide 114. In an embodiment of the present method no additional anneal is required. In another embodiment an additional anneal of the niobium monoxide 114 may be performed prior to the formation of the source and drain. Any anneal of the niobium monoxide material is preferably done in the absence of oxygen. The niobium monoxide material 114 is then etched to form a gate 124.

Figure 7:
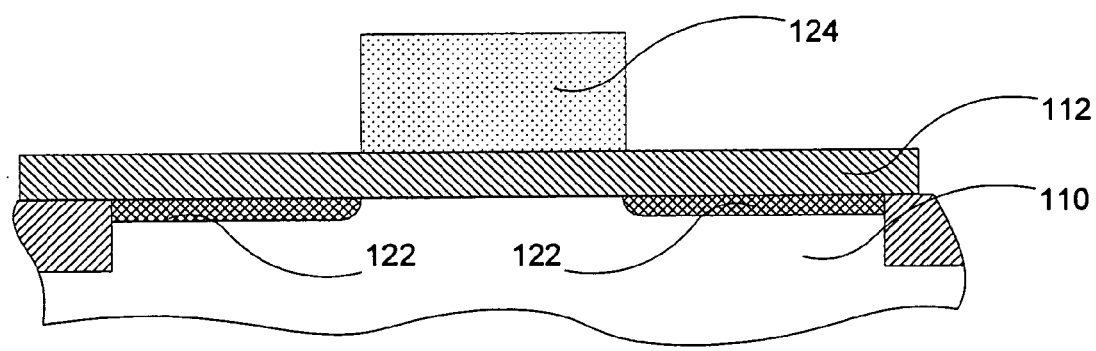
FIG. 7 shows a cross-sectional view of a gate structure during CMOS processing.

The photoresist is then removed, as shown in FIG. 7. Additional processing may then be performed to complete the device, including for example depositing insulating material and then forming contacts to the gate 124, and the source and drain regions 122.

In an embodiment of the present method, the ashing steps may expose the surface of the gate 124 to oxygen. This oxygen will tend to oxidize the gate forming a surface layer of insulating material. This surface layer of insulating material may not degrade the gate performance. A portion of the surface insulating material will be removed when the gate contact is formed, so that contact can be made to the gate.

If the oxidation caused by annealing in oxygen or ashing is determined to degrade the gate unacceptably, care can be taken to reduce, or eliminate, oxygen during the annealing or ashing processes to reduce, or eliminate, the oxidation of the gate. A capping layer (not shown) may be used to protect the gate from unwanted oxygen exposure. The capping layer may surround the gate, or if sidewalls are present the capping layer may just cover the exposed upper surface of the gate. In one embodiment, the capping layer is composed of a material, for example silicon nitride. During subsequent contact etching a portion of this capping layer will be removed to make electrical contact with the gate. In another embodiment, the capping layer is a conductive barrier metal, such as TiN, which may be deposited immediately after the niobium monoxide, to form a TiN/niobium monoxide gate stack. The capping layer may be deposited prior to depositing and patterning the photoresist.

Figure 8:
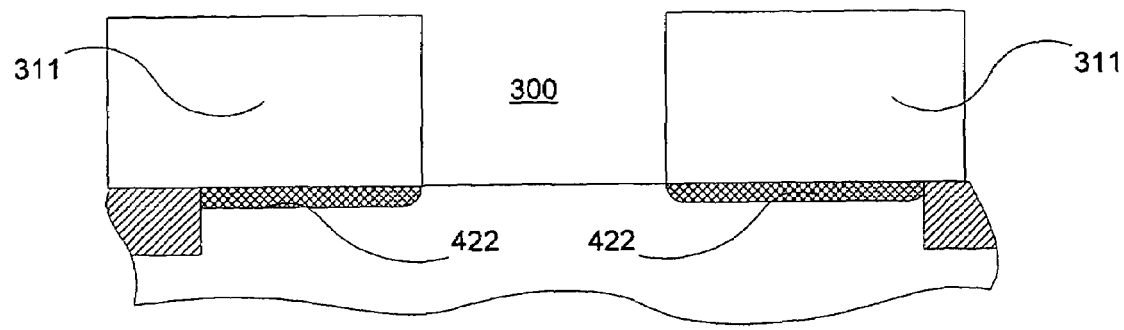
FIG. 8 shows a cross-sectional view of a gate structure during replacement gate CMOS processing.
Figure 9:
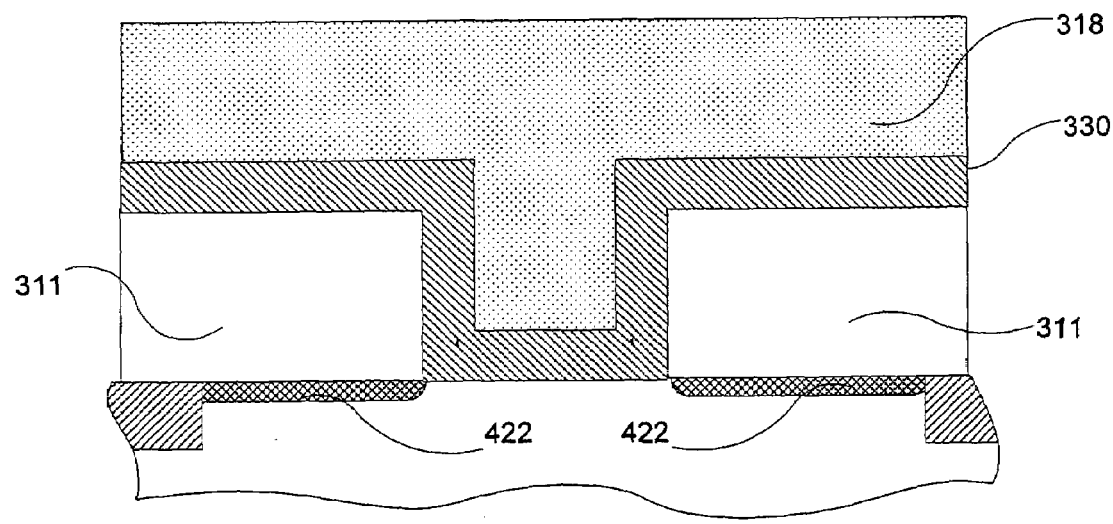
FIG. 9 shows a cross-sectional view of a gate structure during replacement gate CMOS processing.
Figure 10:
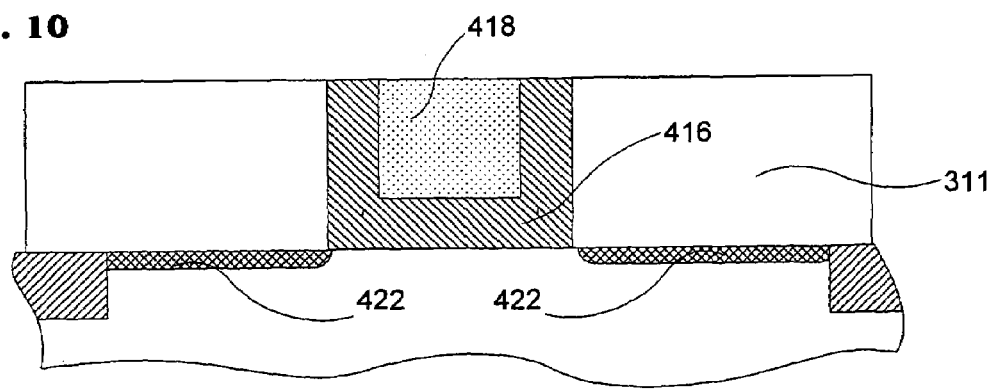
FIG. 10 shows a cross-sectional view of a gate structure during replacement gate CMOS processing.

Referring now to FIGS. 8–10, NbO can be incorporated into replacement gate CMOS process flow. In one embodiment, a substitute gate (not shown) is formed and used to align the source and drain implantation, and anneal processes. An insulating material 311 is then deposited over the substitute gate and planarized to expose the substitute gate. The substitutes gate is then removed leaving a trench 300, which exposes the channel region of the substrate, as shown in FIG. 8, or a previously formed gate dielectric.

A gate dielectric 330 can be deposited into the trench 300 as shown in FIG. 9. A layer of niobium monoxide 318 is then be deposited over the gate dielectric. The layer of niobium monoxide 318 may be sputter deposited to a thickness of about 1.5 times the depth of the trench.

Alternatively, the gate dielectric layer may have been formed prior to the formation of the substitute gate. The removal of the substitute gate would then expose the gate dielectric layer, and a layer of niobium monoxide 318 could be deposited over the gate dielectric layer.

FIG. 10 shows an embodiment of a transistor structure using a replacement gate process flow, following planarization of the layer of niobium monoxide and the gate dielectric to form a dielectric layer 416, and a niobium monoxide gate 418. A CMP process may be used to accomplish the planarization. Additional processing may be used to complete the transistor structure and provide electrical contact to the gate 418 and the source and drain regions 422.

Several embodiments have been provided as examples. The scope of the present invention should not be limited to these examples, and shall be determined by the following claims.

What is claimed is:

1. A MOSFET gate structure comprising:
   a gate dielectric overlying a substrate;
   a predominantly niobium monoxide gate overlying the gate dielectric; and
   a conductive barrier metal capping layer overlying the niobium monoxide gate.

* * * * *